(12) United States Patent
Sapre et al.

(10) Patent No.: US 8,759,223 B2
(45) Date of Patent: Jun. 24, 2014

(54) DOUBLE PATTERNING ETCHING PROCESS

(75) Inventors: Kedar Sapre, San Jose, CA (US); Jing Tang, San Jose, CA (US); Ajay Bhatnagar, Santa Clara, CA (US); Nitin Ingle, San Jose, CA (US); Shankar Venkataraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/593,412

(22) Filed: Aug. 23, 2012

(65) Prior Publication Data

US 2013/0048605 A1 Feb. 28, 2013

Related U.S. Application Data

(60) Provisional application No. 61/528,137, filed on Aug. 26, 2011.

(51) Int. Cl.
*H01L 21/311* (2006.01)
*H01L 21/302* (2006.01)
*H01L 21/461* (2006.01)

(52) U.S. Cl.
USPC ........... 438/700; 438/701; 438/702; 438/706; 438/717; 438/719

(58) Field of Classification Search
None
See application file for complete search history.

(56) References Cited

U.S. PATENT DOCUMENTS

| | | | |
|---|---|---|---|
| 4,259,145 A | 3/1981 | Harper et al. | |
| 2007/0087573 A1 | 4/2007 | Chiang et al. | |
| 2007/0161218 A1 | 7/2007 | Ichinose et al. | |
| 2008/0142483 A1* | 6/2008 | Hua et al. | 216/67 |
| 2008/0182382 A1* | 7/2008 | Ingle et al. | 438/435 |
| 2009/0104782 A1 | 4/2009 | Lu et al. | |
| 2009/0117491 A1 | 5/2009 | Hendel et al. | |
| 2010/0093151 A1* | 4/2010 | Arghavani et al. | 438/424 |
| 2011/0070738 A1 | 3/2011 | Liang et al. | |
| 2011/0151674 A1 | 6/2011 | Tang et al. | |
| 2011/0195576 A1 | 8/2011 | Ko et al. | |

FOREIGN PATENT DOCUMENTS

| KR | 10-0714305 | 5/2007 |
|---|---|---|
| WO | WO-0249078 A2 | 6/2002 |
| WO | WO-2006002138 A2 | 1/2006 |
| WO | WO-2009085965 A1 | 7/2009 |

OTHER PUBLICATIONS

International Search Report, PCT Application PCT/US2009/061390, mailed May 25, 2010.

* cited by examiner

*Primary Examiner* — Duy Deo
(74) *Attorney, Agent, or Firm* — Ashok K. Janah; Janah & Associates, P.C.

(57) ABSTRACT

A method of etching a substrate comprises forming on the substrate, a plurality of double patterning features composed of silicon oxide, silicon nitride, or silicon oxynitride. The substrate having the double patterning features is provided to a process zone. An etching gas comprising nitrogen tri-fluoride, ammonia and hydrogen is energized in a remote chamber. The energized etching gas is introduced into the process zone to etch the double patterning features to form a solid residue on the substrate. The solid residue is sublimated by heating the substrate to a temperature of at least about 100° C.

20 Claims, 11 Drawing Sheets

DOUBLE PATTERNING ETCHING PROCESS

CROSS-REFERENCE

The present application is a continuation U.S. Provisional Application No. 61/528,137 filed Aug. 26, 2011, which is incorporated by reference herein and in its entirety.

BACKGROUND

Embodiments of the present invention relate to etching processes for double patterning features.

Electronic circuits, such as integrated circuits, display circuits, memory circuits, power circuits, and photovoltaic circuits (e.g., solar cells) are being made ever smaller to increase portability, computing power or power output. Thus, the sizes of the active and passive features of these circuits, such as semiconducting features, gates, electrodes, resistors, memories, interconnects, and photovoltaic cells, are also becoming ever smaller. Features are being dimensioned at 65 nm or even 45 nm or smaller and new processes are being developed to make features with even smaller geometries. For example, double patterning (DP) processes use multiple lithography processing steps to obtain features with smaller dimensions—for example, exemplary double patterning processes are described in commonly assigned US Patent Publication No. 2009/0117491 to Hendel et al. filed on Aug. 17, 2008, entitled "Resolution Enhancement Techniques Combining Interference-Assisted Lithography with other Photolithography Techniques", which is incorporated by reference herein and in its entirety.

In the fabrication of DP features, silicon-containing dielectric materials are used as etch-stop layers to protect underlying features and form overlying spacers or gap fillers between metal lines, vias, and memory elements. Commonly-used silicon-containing dielectric features are composed of silicon dioxide, silicon nitride and silicon oxy-nitride. In the DP process, the deposited dielectric features need to be etched without damaging surrounding and underlying features. For example, in some applications, a dielectric feature that is an etch-stop layer is etched away after other features in the DP stack are etched. In other applications, portions of the dielectric feature are etched away while other portions are allowed to remain on the DP structure.

In conventional patterning processes, wet chemical etching processes are used to chemically etch the dielectric portions of conventional patterning features and thereafter the patterned substrate is rinsed and dried. The wet chemical etching processes allow etching of the dielectric features with controlled etch stop capabilities because the chemical etching process automatically terminates when the particular dielectric material being etched is entirely removed. The etch stop capabilities are important to prevent over etching of the dielectric portions of the features and subsequent etching into underlayers or surrounding materials. Conventional chemical solutions used in patterning processes to remove the dielectric layer include hydrofluoric acid or dilute hydrofluoric acid which can be a solution of hydrofluoric acid and deionized water, or hot phosphoric acid.

However, advanced DP features being currently developed have smaller width dimensions resulting in trenches or lines having high aspect ratios, and can be adversely affected by wet processing. In particular, the use of wet chemical diluted acid solutions to etch dielectric materials between or on such high aspect ratio features can result in variable etching rates for different dielectric. The variable etching rates can be a result of the surface tension of the wet chemical solution, which can impede effective etching in the narrow gaps between high aspect features. Further, severe feature line bending can occur during the drying step when the chemical etching liquid is removed or when the subsequent rinse liquid is removed from between the tight, high aspect ratio spaces, as illustrated in FIG. 1. Feature bending occurs because the high aspect ratio features are not strong enough to withstand surface tension forces during the drying process. In the drying process, the surface tension force applied by the liquid between the features is gradually removed as the liquid evaporates causing narrow dimensioned features to buckle. Quantitatively, the maximum tolerable sidewall deformation δ between features is given by the formula:

$$\delta = 3\sigma \cos\theta \frac{H^4}{dEL^3}$$

where $\sigma$ is the surface tension of the liquid, $\theta$ is the deformation angle at the top of the bent line pattern, between the meniscus of the drying liquid surface and the sidewall, H is the height of the feature, d is the spacing between adjacent high aspect ratio features, E is the Young's modulus and L is the thickness of the high aspect ratio feature.

Drying can also leave water marks if not done properly because the chemical reaction between the wet chemical agent and the dielectric material can leave behind a chemical residue that is not completely removed in the wet chemical etching process, nor by the subsequent rinse process. Still further, certain dielectric materials, such as silicon oxy-nitride, etch at much slower rates than non-nitride oxide features, and thermal oxide and annealed oxide features also etch at different rates compared to deposited oxide layers. This causes significant etching variability between the different features on a particular substrate.

Reactive ion etching (RIE) processes are dry etching processes that have been used to etch conventional dielectric materials, as for example described in commonly assigned US patent publication number 20090104782 A1, entitled "Selective Etching of Silicon Nitride", by Lu et al. filed on Oct. 7, 2008, which is incorporated by reference herein in its entirety. However, in RIE etching processes, the plasma species energetically impinge on the substrate resulting in an etching process which has both a chemical etching and a physical bombardment component. The physical bombardment during conventional RIE etching processes can excessively etch and cause lattice damage in the dielectric layer. Further, as the RIE process relies on the kinetic energy of the etching species, RIE does not have a good etch selectivity and can excessively etch adjacent features. The poor selectivity of RIE further means that RIE processes can etch through features and into underlayers, which can be undesirable. For these reasons, conventional RIE processes are not being used for hard mask removal in DP feature fabrication processes.

For various reasons that include these and other deficiencies, and despite the development of various processes for etching portions of double patterning features, further improvements in such etching processes are continuously being sought.

SUMMARY

A method of etching a substrate comprises forming on the substrate a plurality of double patterning features composed of silicon oxide, silicon nitride, or silicon oxynitride. The substrate having the double patterning features is provided in a process zone of a process chamber. An etching gas comprising nitrogen tri-fluoride, ammonia, and hydrogen is energized in a remote chamber. The energized etching gas is introduced into the process zone to etch the double patterning features to form a solid residue on the substrate. The solid residue is sublimated by heating the substrate to a temperature of at least about 100° C.

In another etching method, a substrate having a plurality of double patterning features composed of silicon oxynitride is provided in a process zone of a process chamber. An etching gas is energized in a remote chamber, the etching gas comprising nitrogen tri-fluoride, ammonia and hydrogen. The etching gas comprises a molar ratio of ammonia to nitrogen trifluoride of at least a 1:1 and a molar ratio of ammonia to hydrogen of from about 1:1 to about 1:10. The energized etching gas is introduced into the process zone of the process chamber to etch the double patterning features to form a solid residue on the substrate. The solid residue is sublimated by heating the substrate to a temperature of at least about 100° C.

In still another etching method, a substrate having a plurality of double patterning features composed of silicon oxynitride is provided in a process zone of a process chamber. An etching gas is energized in a remote chamber, the etching gas comprising hydrogen in a flow rate of from about 10 sccm to about 3,000 sccm; nitrogen trifluoride in a flow rate of from about 10 sccm to about 1,000 sccm; and ammonia in a flow rate of from about 10 sccm to about 1,000 sccm. The energized etching gas is introduced into the process zone of the process chamber to etch the double patterning features to form a solid residue on the substrate. The solid residue is sublimated by heating the substrate to a temperature of from about 115° C. to about 200° C.

In another method of etching a substrate, a plurality of double patterning features comprising silicon oxide, silicon nitride, or silicon oxynitride are formed on a substrate and the substrate is provided in a process zone of a process chamber. An etching gas is introduced into the process zone of the process chamber to etch the double patterning features to form a solid residue on the substrate, the etching gas comprising hydrogen fluoride, ammonia, and hydrogen. The solid residue is sublimated by heating the substrate to a temperature of from about 115° C. to about 200° C.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
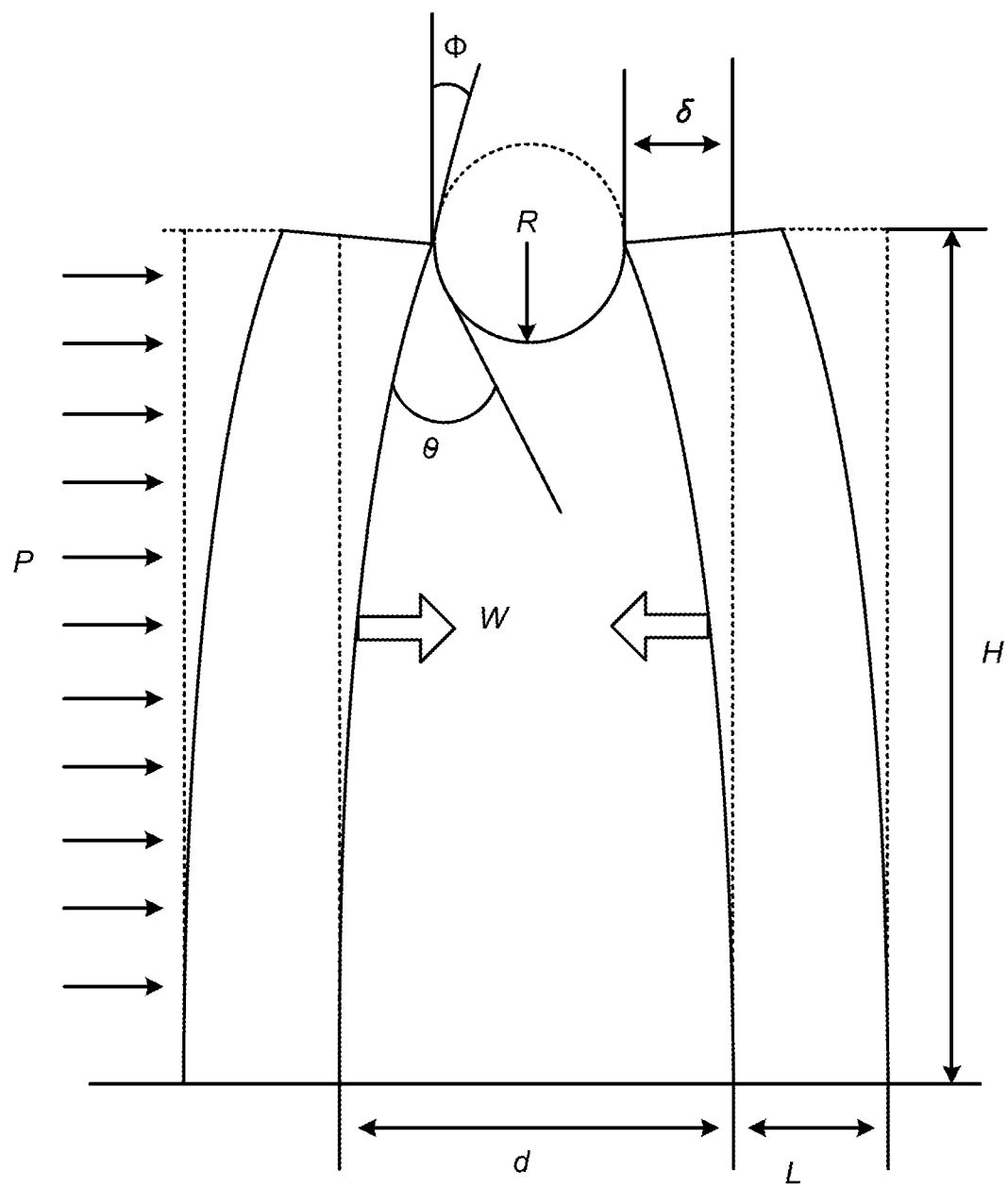
FIG. 1 (PRIOR ART) is a schematic cross-sectional side view of a high aspect ratio DP feature showing bending of the feature during a drying process conducted to remove residual rinse liquid that remains between the DP features after wet rinse of the dielectric portions of the features.
Figure 1A:
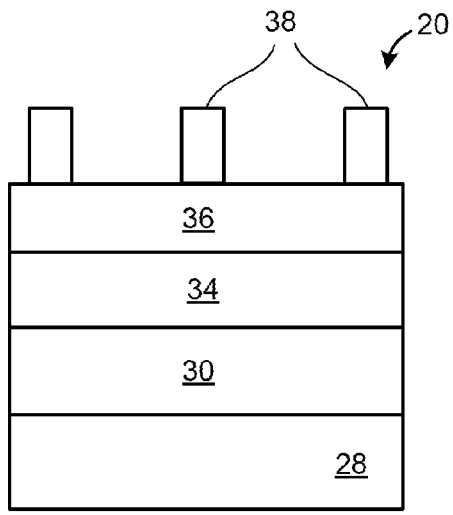
FIGS. 1A-1I are schematic cross-sectional views of a substrate undergoing an exemplary embodiment of a double patterning fabrication process.

Embodiments of the present etching process are useful for etching portions of a semiconductor structure 20 during the fabrication of double patterning (DP) features 26 on a substrate 28, as shown for example in FIGS. 1A to 1J. Referring to FIG. 1A, the substrate 28 can be, for example, a silicon substrate, a III-V compound substrate such as gallium arsenide, a germanium or silicon/germanium (SiGe) substrate, an epi-substrate, a silicon-on-insulator (SOI) substrate, a display substrate such as a liquid crystal display (LCD), a plasma display, an electro luminescence (EL) lamp display, or a light-emitting diode (LED) substrate. In some versions, the substrate 28 can be a semiconductor wafer, such as a silicon or germanium wafer, or a suitable compound semiconductor, such as silicon germanium carbide, gallium arsenic phosphide, or gallium indium phosphide. In other versions, the substrate 28 can be a dielectric plate, such as polymer or glass panel (e.g., acrylics, polyimide, and silicate glass panels), diamond, or a suitable compound semiconductor such as silicon carbide, indium arsenide, or indium phosphide. Alternatively, the substrate 28 may be a non-semiconductor material such as a glass substrate for thin-film-transistor liquid crystal display (TFT-LCD) devices, or fused quartz or calcium fluoride for a photomask (mask or reticle). The substrate 28 may include various doped regions, dielectric features, and multilevel interconnects. In one embodiment, the substrate 28 includes various doped features for various microelectronic components such as complementary metal-oxide-semiconductor field-effect transistor (CMOSFET), imaging sensor, memory cell, and/or capacitive element. In another embodiment, the substrate 28 includes features made from conductive or dielectric materials which are configured for coupling or isolating active features. The substrate 28 can also include one or more material layers formed thereon. The substrate can have a diameter of 200 mm, 300 mm, or even 400 mm.

Figure 1D:
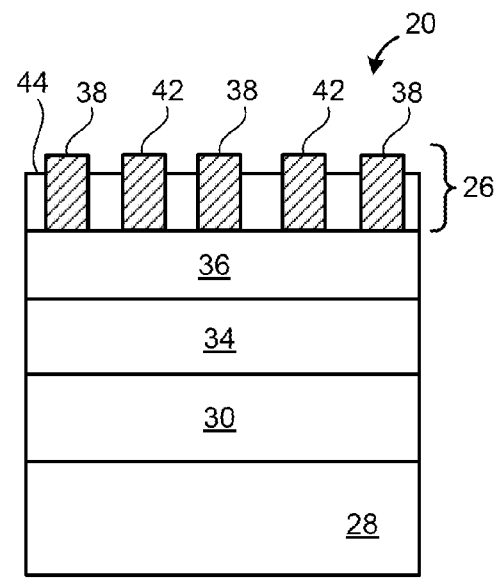
Figure 1E:
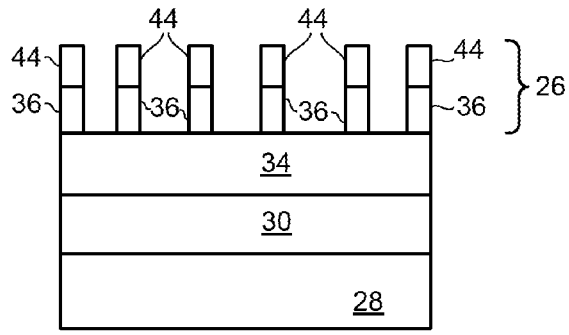
Figure 1F:
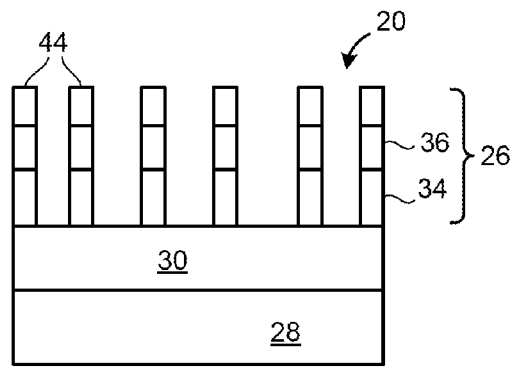
Figure 1G:
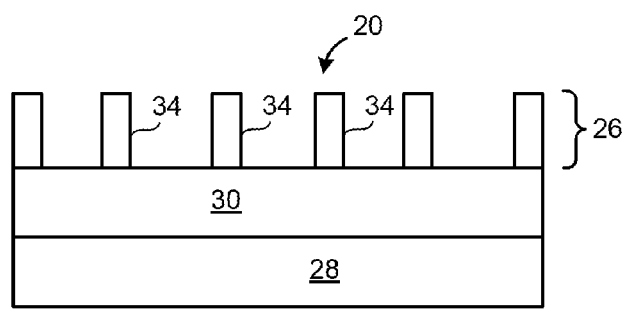
Figure 2:
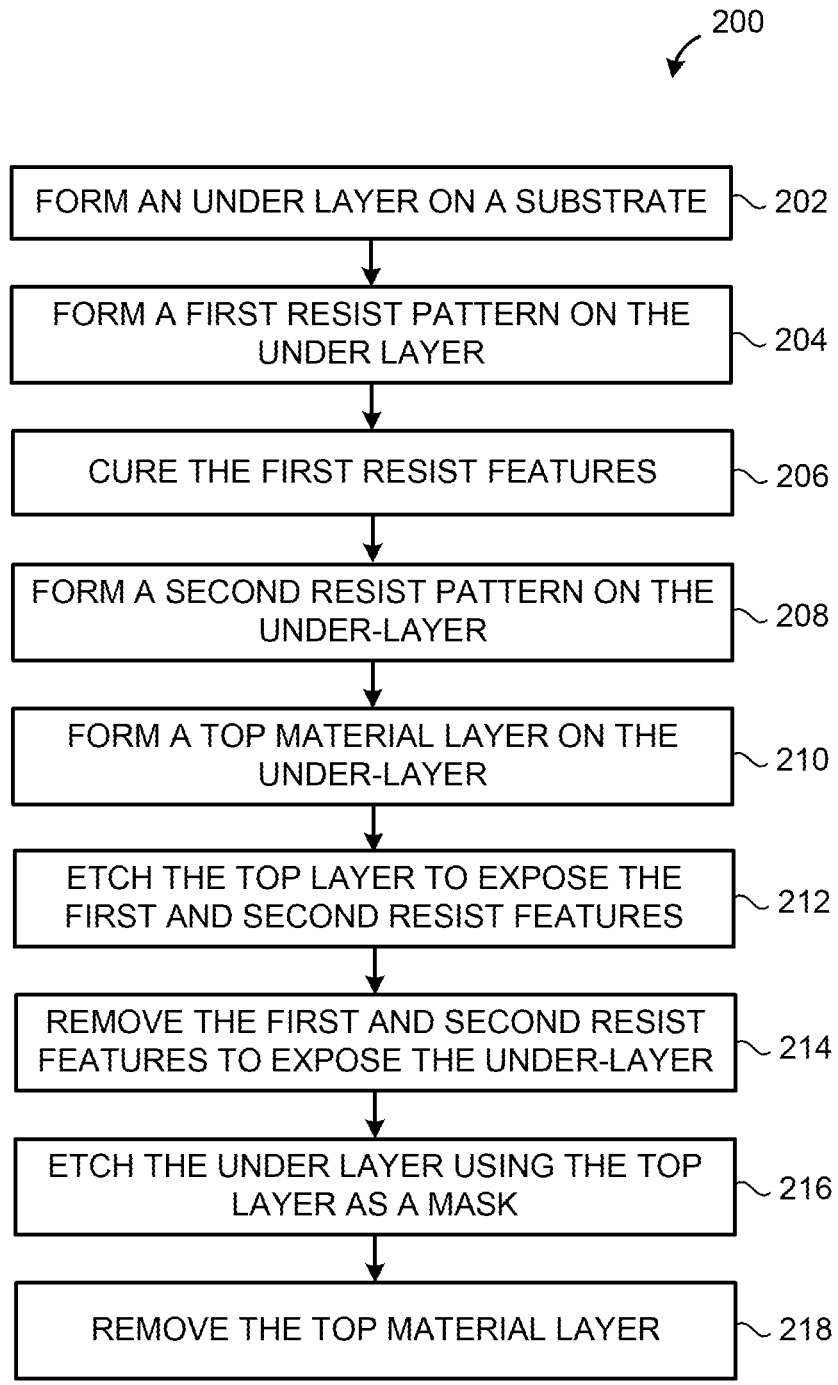
FIG. 2 is a flow chart of the double patterning process used to fabricate the structure of FIGS. 1A to 1I.

An embodiment of a double patterning process 200, which uses a double lithographic process to pattern a plurality of the double patterning (DP) features 26 of the semiconductor structure 20 in a series of fabrication steps, is illustrated in FIG. 2. The etching process is used to etch portions of DP features 26 which are used in double patterning or self-aligned double patterning (SADP) processing methods. The DP features 26 can be in the form of a continuous layer (as shown in FIG. 1D) or a plurality of features (as shown in FIGS. 1E to 1G). The DP features 26 include any of the features described below, such as the dielectric layer 30, mask layer 34, anti-reflective layer 36, first resist features 38, second resist features 42, top layer 44, photoresist layer 50, template layer 52, trimmed resist features 54, template features 58, spacers 60, gap filler 64, line pattern 68, or still other features.

The DP features 26 comprise silicon-containing dielectric materials such as silicon oxide, silicon nitride, or silicon oxy-nitride. The DP features 26 require etching methods which can etch-stop at the beginning of the silicon-containing dielectric or just after etching through the dielectric material. As one example, the DP features 26 can be an etch-stop layer.

As another example, the DP features 26 can be sidewall spacers. The present etching process can be used to etch these and other portions of the DP features 26 with controlled etch-stop capabilities and to provide better etch penetration into the spaces between the features, as compared with conventional wet etching processes which are limited by surface tension forces from penetrating the spaces between high aspect ratio DP features 26. The DP features 26 can have a thickness (or height) of from about 100 angstroms to about 10,000 angstroms.

The double patterning process 200 begins by forming a dielectric layer 30 on the substrate 28 as in step 202. A mask layer 34 can be formed on the dielectric layer 30 to serve as a hard mask during later etching process for patterning the dielectric layer 30 and/or the substrate 28. In one embodiment, the mask layer 34 includes a carbon-containing material layer formed by a suitable process such as spin-coating, e.g., a carbon-containing layer comprising silicon carbide. The mask layer 34 can have a thickness ranging between about 50 angstroms and about 1000 angstroms. An anti-reflective layer 36 may also be formed on the mask layer 34 to reduce reflection during lithography, such as a bottom anti-reflective coating (BARC) having a thickness of from about 50 angstroms to about 1000 angstroms, which is formed by spin-coating.

A plurality of first resist features 38 is then formed on the substrate 28, as in step 204. For example, the first resist features 38 can be formed by coating the substrate with a resist layer and then patterning the resist layer with a conventional lithography process. The first resist features 38 are spaced apart by a plurality of openings such that portions of the anti-reflective layer 36, mask layer 34, and dielectric layer 30 are below the exposed openings, according to a predetermined pattern. For example, the first resist features 38 can include interconnect lines having a thickness of from about 100 angstroms to about 5000 angstroms, which are spaced apart from about 50 nm to about 200 nm. The first resist features 38 are made of an etch-resistant material which can be a positive-type resist or a negative-type resist. The first resist features 38 are formed by the first lithography process that includes steps of resist coating, soft baking, mask aligning, exposing, post-exposure baking, developing, and hard baking. For illustration, the exposing process may be carried out by exposing a resist layer to a radiation beam (such as ultraviolet (UV) or EUV, e.g., a 248 nm beam from a Krypton Fluoride (KrF) excimer laser, or a 193 nm beam from an Argon Fluoride (ArF) excimer laser) through a mask having a predefined pattern (or a reversed pattern). The lithography patterning process can also use other proper methods such as maskless lithography, electron-beam radiation, or ion-beam radiation. After patterning the resist features 38, the features 38 are hardened by curing, as in step 206. The curing process hardens the first resist features 38 to prevent deformation by a later lithography process used to form a second resist layer. The curing process includes thermal curing, ultraviolet (UV) curing, ion implant bombard, e-beam treatment, or combinations thereof.

Figure 1B:
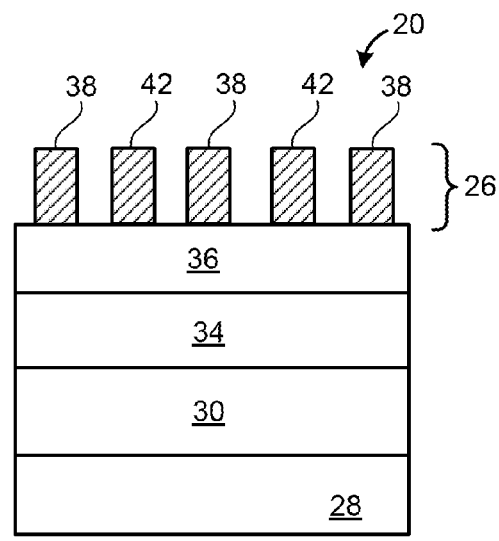

Thereafter, a plurality of second resist features 42 are formed by a second lithography process, as in step 208, illustrated in FIG. 1B. In this process, a second resist layer is formed and then is patterned to form second resist features 42 with a plurality of openings therebetween. In one embodiment, the second resist features 42 are interposed between the first resist features 38. The second resist features 42 are configured relative to the first resist features 38 so as to utilize a self-aligned patterning structure. In one embodiment, the openings in the first and second resist features 38, 42, respectively, are configured to achieve pitch splitting—for example, the first and second resist features 38, 42 can be configured to have a split pitch as half of the pitch of first resist features 38 or the second resist features 42. After the formation of both the first and second resist features 38, 42, a pitch—which is defined as the distance between a first resist feature 38 and an adjacent second resist feature 42—is halved, resulting in a reduced size of resultant features formed after etching the underlayers. In another embodiment, the openings defined by the first and second resist features 38, 42 can be configured to form contact holes or trenches for metal interconnect lines. For example, the second resist features 42 can be lines which are interdigitated with lines of the first resist features 38. The second resist features 42 are typically substantially similar in composition and thickness to the first resist features 38.

Figure 1C:
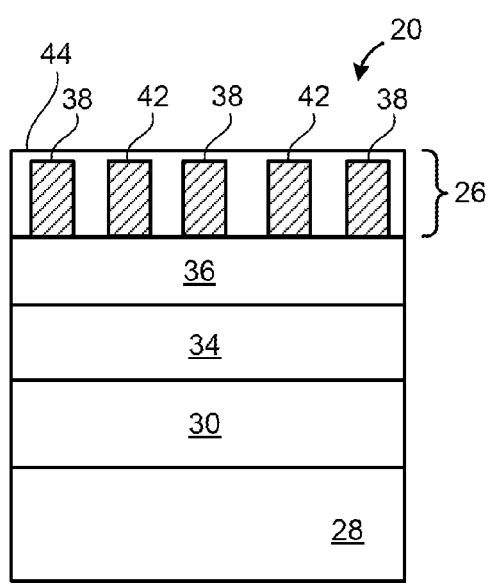

A top layer 44 is then formed on the substrate 28, as in step 210, to fill in the openings defined by the first and second resist features 38, 42, and, in some versions, cover the resist features 38, 42, as illustrated in FIG. 1C. The top layer 44 may have a thickness greater than that of the first and second resist features 38, 42, e.g., from about 500 to about 2000 angstroms. In one version, the top layer 44 comprises a silicon-rich material formed by spin-on coating, such as a silicon-containing organic polymer, which is thermally baked for cross-linking. Alternatively, the top layer 44 may include a silicon-containing inorganic polymer, such as silicone. In still other embodiments, the top layer 44 may include a layer of silicon oxide, silicon nitride or silicon oxynitride, which is formed by spin-on coating or chemical vapor deposition (CVD). The top layer 44 is etched to expose the top surfaces of the first and second resist features, 38, 42 as shown in FIG. 1D, in an etching process per step 212, as described below.

Thereafter, both the first resist features 38 and the second resist features 42 are removed in step 214, as shown in FIG. 1E. Conventional ashing or resist stripping processes which heat the residual resist in an oxygen environment can be used to remove the resist material and the uncovered anti-reflective layer 36. The anti-reflective layer 36 uncovered by the top layer 44 is also etched away during the etching process.

The removal of the first and second resist features 38, 42 results in the formation of a plurality of SP features 26, as illustrated in FIGS. 1E and 1F. The dielectric layer 30 is exposed between openings defined by the DP features 26 and can then be etched in a reversed pattern relative to the first and second resist features 38, 42. As one example, the reversed pattern can correspond to contact holes or trenches to be formed in the dielectric layer 30. In another example, the reversed pattern can correspond to interconnect lines.

In step 216, the exposed portions of the dielectric layer 30 are etched. In one version, the mask layer 34 uncovered by the top layer 44 is removed, therefore transferring the openings defined in the top layer 44 into the mask layer 34 to form still longer DP features 26. In one embodiment, the etching process etches the mask layer 34 at a higher etch rate than the etch rate of the top layer 44, resulting in removal of the exposed portions of the mask layer 34. For example, the etching process gas can include nitrogen, oxygen, hydrogen, and carbon fluoride, which can transform the silicon-containing material of the top layer 44 into a silicon nitride or oxynitride, which provides better etch rates.

In still another version, the top layer 44 is etched away after etching the dielectric layer 30 as in step 218, and as shown in FIG. 1G. Again this step 218 can use a plasma etching process to remove the top layer 44, which is now converted into a silicon nitride or oxynitride. The anti-reflective layer 36 can also be removed by the same etching process or another etching process.

Figure 1H:
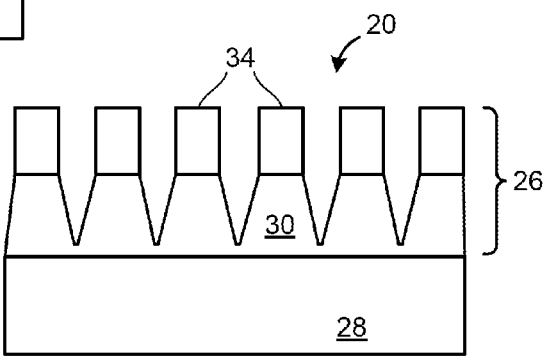
Figure 1I:
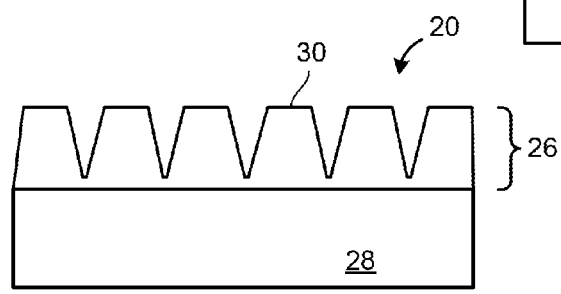

In another version, the dielectric layer 30 can be removed using the patterned mask layer 34 as a hard mask to transfer the defined openings from the mask layer 34 to the dielectric layer 30, as illustrated in FIG. 1H. In this version, the dielectric layer 30 is etched away within the openings of the patterned mask layer 34 to form a plurality of trenches or contact holes passing through the dielectric layer 30, using the etching process described herein. During the etching process, the residual mask layer 34 is also gradually etched away, leaving the structure shown in FIG. 1I.

The method described above with reference to FIGS. 1A to 1I illustrates an exemplary embodiment of a double patterning process which uses double lithography exposures, etching processes, and ashing or stripping processes to fabricate features on a substrate 28.

Figure 3:
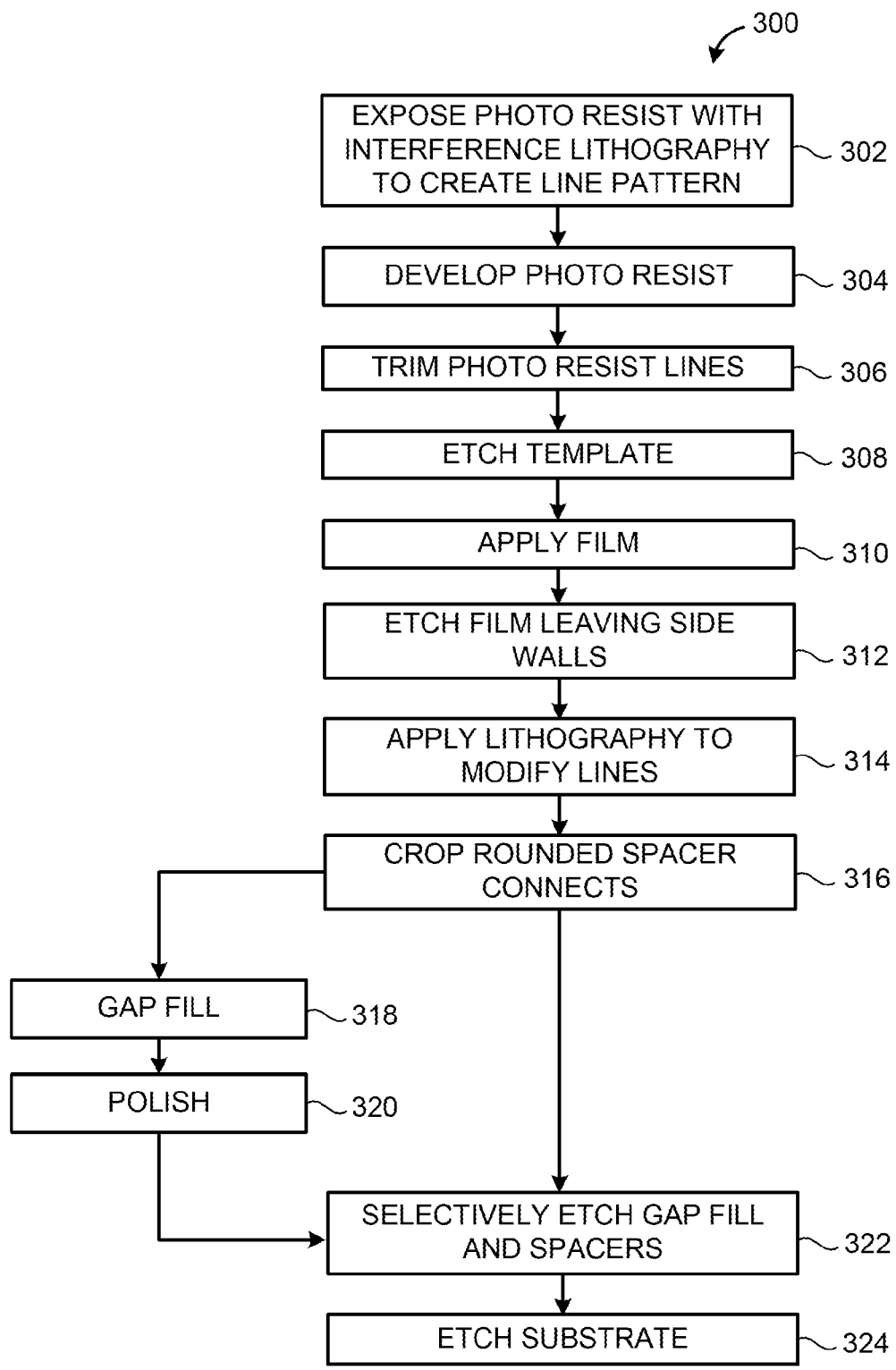
FIG. 3 is a flow chart of an exemplary embodiment of a self-aligned double patterning process.

An illustrative example of a self-aligned patterning process comprising a self-aligned double patterning (SADP) process 300, as illustrated by the flow chart of FIG. 3, uses DP features 26 comprising spacers 60 used in sidewall patterning methods, as shown in FIGS. 4A to 4G. In this version, sidewall spacers are used in sidewall patterning methods to create a hardmask or photoresist layer which can increase (e.g., double) the printed line density of the features formed on the substrate 28. In this version, conventional interference lithography systems and methods are used to provide a interference line (IL) pattern having a resolution around 22 to 30 nm half pitch using, for example, a light source operating at 157 nm in a high index immersion. SADP methods are then used to double the density of this line pattern to provide a line pattern with a resolution around 11 to 15 nm half pitch.

Figure 4A:
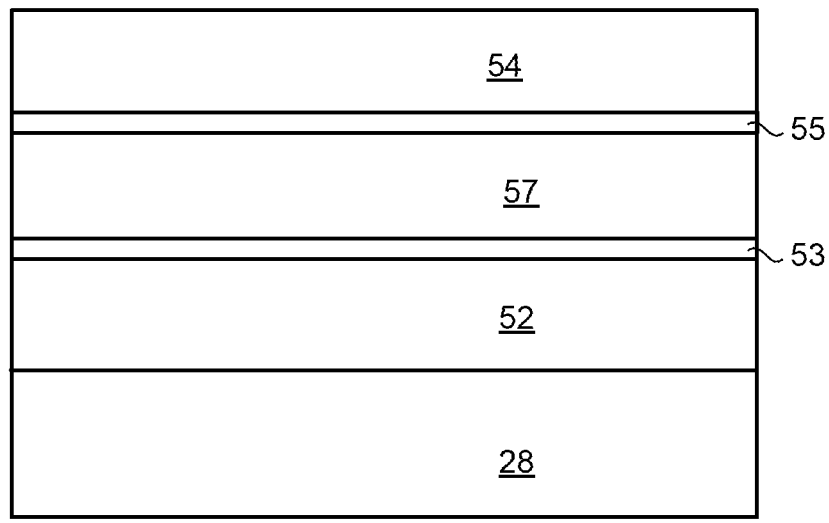
FIGS. 4A-4K are schematic cross-sectional views of a substrate undergoing the self-aligned double patterning process of FIG. 3, using a positive tone resist.
Figure 4B:
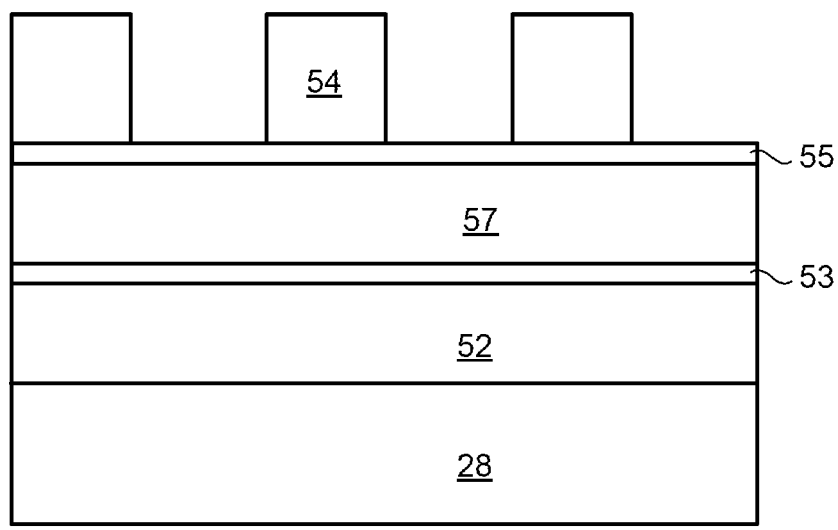
Figure 4C:
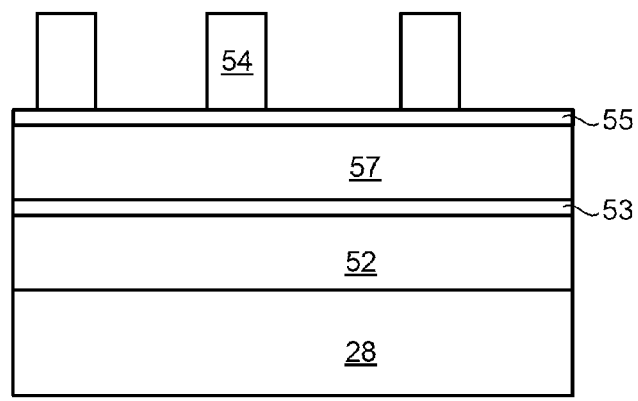
Figure 4D:
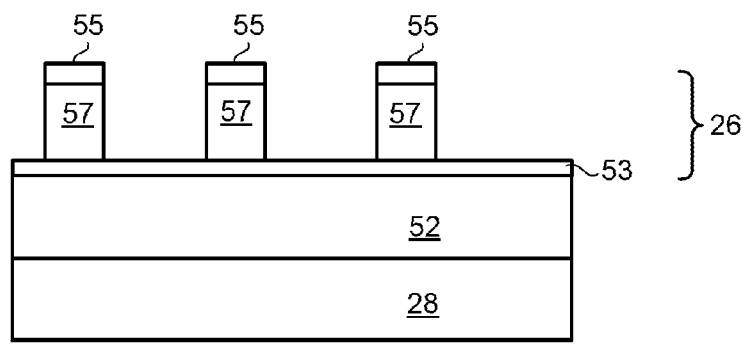

The interference line and SADP process uses a positive tone resist and an IL pattern on a hardmask to fabricate a high-density SADP pattern. Hard mask layers 53 and 55 are described below, but it should be understood that either or both of these layers can alternately be an antireflective coating layer having some hard mask properties. Initially, two pairs of template layers are deposited over a substrate, a first template layer 52 with a first hard mask layer 53, and a second template layer 57 with a second hard mask layer 55. A photoresist layer 50 is deposited over the second hard mask layer 55, as shown in FIG. 4A. The template layers 52 and 57 are each made from a material that may be selectively etched, such as an Advanced Patterning Film (APF), carbon-doped hardmask, photo-resist, or patterned polysilicon feature. For example, a suitable APF material can be a strippable amorphous carbon hard mask available from Applied Materials, Santa Clara Calif. An IL technique is then used to form a plurality of first resist features 38 in the photoresist layer 50, as shown in FIG. 4B, per step 302 of FIG. 3. After exposure and/or development of the first resist features 38, per step 304, the first resist features 38 are trimmed using a first etch trimming step 306, such as a conventional plasma dry etching step, to form the trimmed resist features 54 having, for example, a line width to line spacing ratio of about 1:3, as shown in FIG. 4C. The underlying second hard mask layer 55 and second template layer 57 are then etched using a second etching process step 308 to etch the exposed portions of the second hard mask layer 55 and second template layer 57 around the trimmed resist features 54. The remnants of the first resist features 38 are removed during the etching step or during another resist ashing or stripping process to leave a pattern of template features 58. The pattern of template features 58 is made up of the portion of the second hard mask layer 55 and second template layer 57 which had been covered by the resist during the etch step, as shown in FIG. 4D.

Figure 4E:
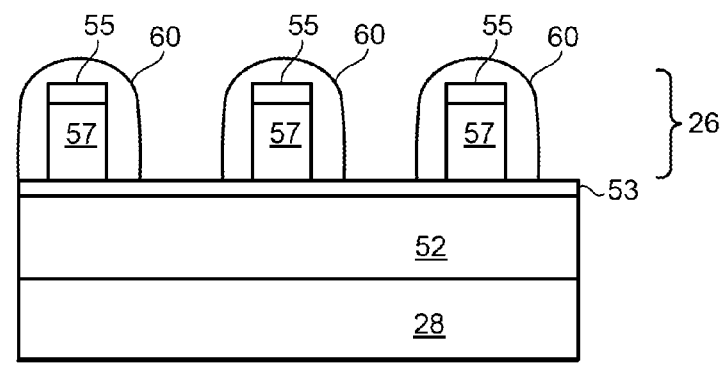
Figure 4F:
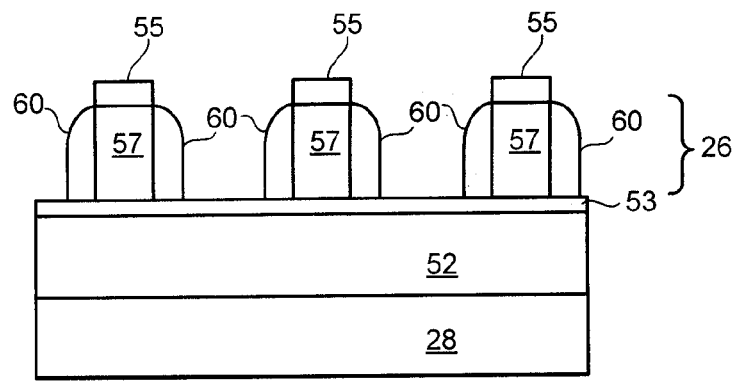
Figure 4G:
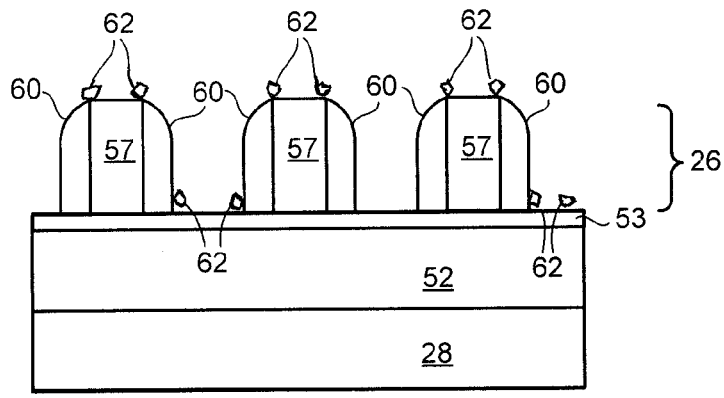
Figure 4H:
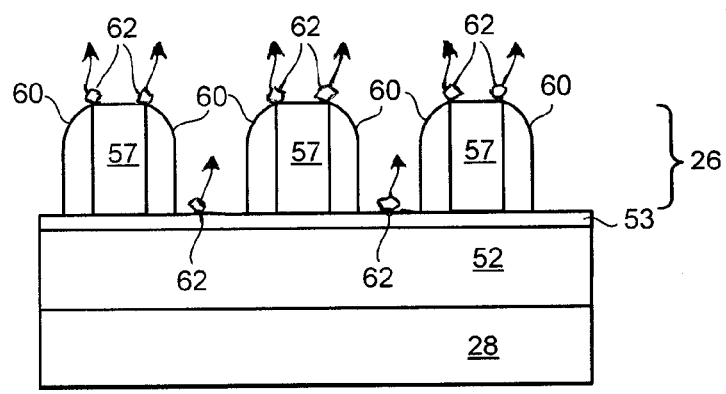
Figure 4I:
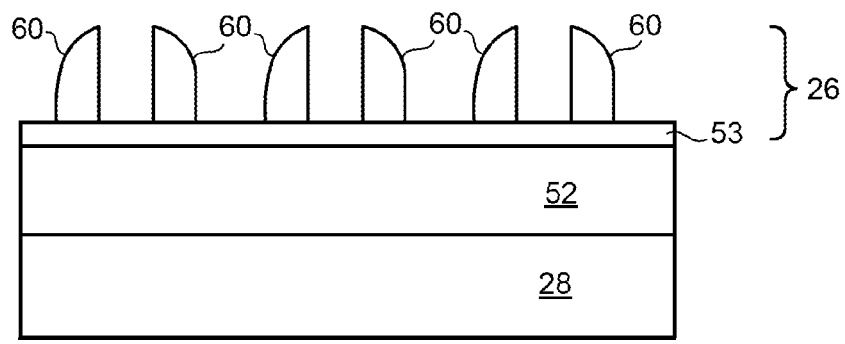
Figure 4J:
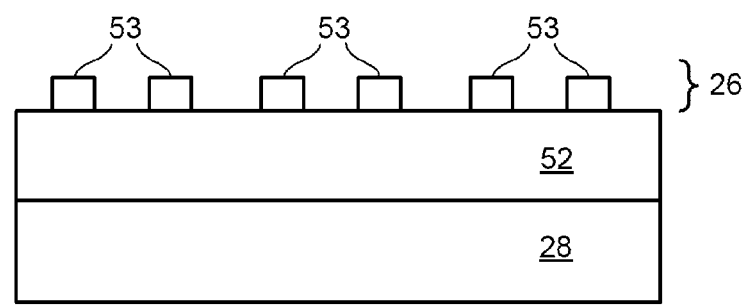
Figure 4K:
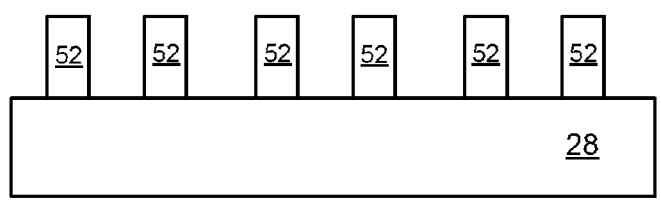

After forming the template features 58, a spacer layer 60 is deposited onto the template features 58 in film deposition step 310, as shown in FIG. 4E, by depositing a film over the template features 58. The spacer layer 60 is then etched until the spacers 60 have the appropriate dimension in step 312, which can include applying lithography methods to modify the lines per step 314 and crop rounding the spacers per step 316, as shown in FIG. 4F. All or a portion of the template features 58, such as the second hard mask layer 55, are then etched away in a partial etching process per step 322, as shown in FIG. 4G-4H and described below. In some embodiments, the second template layer 57 is composed of a material that can be removed by ashing. This results in the substrate 28 having the remaining spacers 60 and without the template features 58, as shown in FIG. 4I. Using the spacers 60, the first hard mask layer 53 may be etched in step 324 to form a spacer pattern in the first hard mask layer 53, after which the spacers are removed to form the structure shown in FIG. 4J. The underlying first template layer 52 can then be etched, and the remaining hard mask layer 53 removed to form a set of SADP features in the first template layer 52, as shown in FIG. 4K. The SADP features can be made to have a pitch of 22 to 30 nm, half the pitch of the IL patterning source.

Figure 5A:
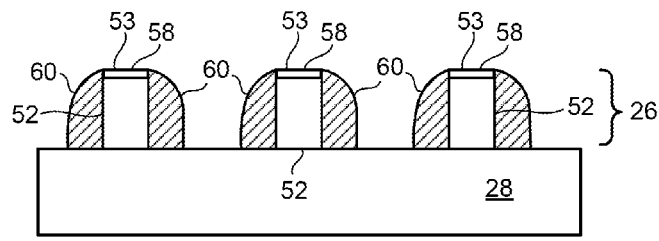
FIGS. 5A-5E are schematic cross-sectional views of a substrate undergoing the self-aligned double patterning process of FIG. 3, using a negative tone resist.
Figure 5B:
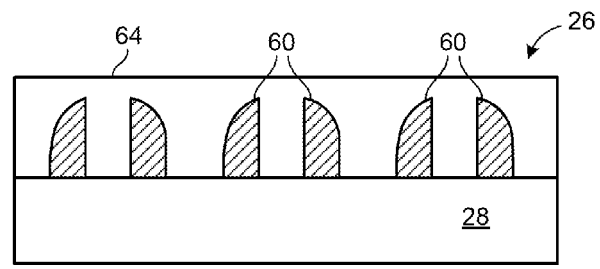
Figure 5C:
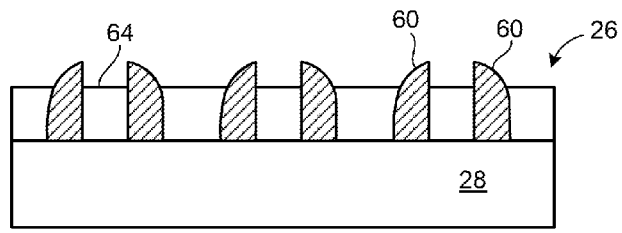
Figure 5D:
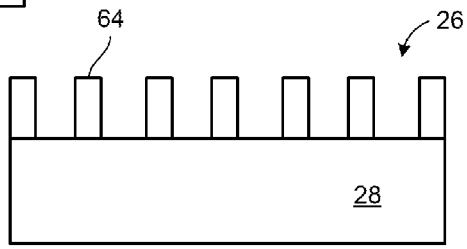
Figure 5E:
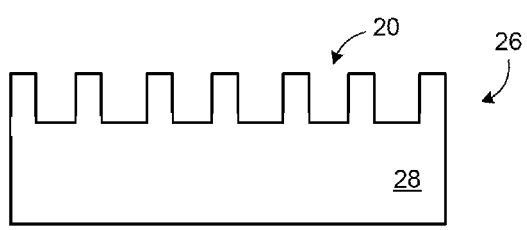

Another exemplary process flow of an IL and SADP process which uses a negative-tone resist is shown in FIGS. 5A-5F. Initially, a series of process steps as described above for FIGS. 4A to 4I is used to form a plurality of spacers 60 that each surround template features 58 on a substrate 28, as shown in FIG. 5A. In the version shown, the template features 58 comprise a first template layer 52 and a hard mask layer 53. Thereafter, all or a portion of the template features 58, such as the hard mask layer 53, are removed by a partial etch process, as described below. A gap filler 64 is deposited filling the gaps between the spacers 60 per step 318, as shown in FIG. 5B. The gap filler 64 and spacers 60 may then be polished by chemical mechanical polishing (step 320) or trimmed by dry plasma etching, to remove the excess portion of the gap filler 64 that covers the top portions of the spacers 60, as shown in FIG. 5C. After that, the spacers 60 may be removed using a selective etching process that does not remove all of the gap filler 64 per step 322, leaving a line pattern 68 in the gap filler 64 as shown in FIG. 5D. The resulting line pattern 68 in the gap filler 64 may then be used to etch a further line pattern structure in the underlying layers on the substrate 28 by etching step 324, after which the gap filler 64 is removed, as shown in FIG. 5E.

While embodiments of DP and SADP processes have been described as exemplary illustrative embodiments, other variations to these methods, including other procedures and process steps, can be used without deviating from the spirit and scope of the invention. For example, additional layers, etching process steps, and deposition process steps may be used as a substitute for, or in addition to, the illustrative process steps, as the types of materials employed can also be changed as would be apparent to those of ordinary skill in the art.

In the processes described above, DP features 26 are formed by various superimposed lithography processes which use resist features, dielectric features, mask layers, spacers, and still other features and layers. In these processes, various embodiments of DP features 26 comprise silicon-containing dielectric, such as silicon oxide, silicon nitride, or silicon oxy-nitride, which is deposited using thermal, chemical vapor deposition (CVD), plasma enhanced chemical vapor deposition (PECVD), or physical vapor deposition (PVD) methods. In some embodiments, the silicon-containing dielectric can be: a thermal CVD oxide, such as high aspect ratio process (HARP) oxide, eHARP oxide, atmosphere pressure CVD (APCVD) oxide, or high temperature undoped silicate glass (HTUSG); high density plasma (HSP) oxide; plasma-enhanced CVD (PECVD) oxide; furnace deposited oxide, such as high temperature oxide, medium temperature oxide, or low temperature oxide; atomic layer deposition (ALD) oxide; and other oxide. In further embodiments, the silicon-containing dielectric can be, for example, PECVD nitride, furnace deposited nitride, HSP nitride, thermal CVD nitride, ALD nitride, and other nitride. Also, in some embodiments, the silicon-containing dielectric may be referred to as a high aspect ratio process (HARP) liner.

In one example, the DP features 26 are deposited on a substrate 28 using a conventional CVD process with a deposition gas that includes silicon-containing, oxygen-containing and nitrogen-containing components, which is decomposed in thermal or plasma process. Suitable silicon-containing components include silane ($SiH_4$), dichlorosilane ($SiH_2Cl_2$), trichlorosilane ($SiHCl_3$), and silicontetrachloride ($SiCl_4$). The silicon-containing component can also be an alkoxy disilane, alkoxy-alkyl disilane, alkoxy-acetoxy disilane and polysilane, Suitable alkoxy disilanes include $Si_2(EtO)_6$ ethoxy disilane, $Si_2(MeO)_6$ methoxy disilane, and $Si_6(MeO)_{12}$ methoxy cyclohexylsilane, where Et denotes ethyl group ($C_2H_6$) and Me denotes methyl group ($CH_3$). In some embodiments, the alkoxy-alkyl disilane may include $Si_2(EtO)_4(Me)_2$ tetraethoxy-dimethyl disilane, $Si_2(EtO)_4(Et)_2$ tetraethoxy-diethyl disilane, $Si_2(EtO)_2(Me)_4$ diethoxy-tetramethyl disilane, $Si_2(MeO)_4(Me)_2$ tetramethoxy-dimethyl disilane, and $Si_4O_2(Me)_8$ methyl cyclohexylsiloxanes, $Si_6(MeO)_6(Me)_6$ methoxy-methyl cyclohexylsilane, $Si_4O_2(H_2)_4$ hydro-cyclohexylsiloxanes. In some embodiments, the alkoxy-acetoxy disilane may include $Si_2(AcO)_6$ acetoxy disilane, $Si_2(Me)_4(AcO)_2$ tetramethyl-diacetoxy disilane, and $Si_2(Me)_2(AcO)_4$ dimethyl-tetracetoxy disilane, where Ac denotes acetyl group. In some embodiments, the polysilane may include cyclopentylsilane or other substitutes. Suitable oxygen-containing components include oxygen, ozone, and other such gases. Suitable nitrogen containing components include nitrogen ($N_2$), ammonia ($NH_3$), hydrazine ($N_2H_4$), or hydrazoic acid ($HN_3$).

While the DP features 26 can be made from silicon dioxide, silicon nitride or silicon oxy-nitride, using silicon oxy-nitride can provide several advantages over silicon dioxide and silicon nitride in some applications. For example, silicon oxy-nitride can be used to form DP features 26 such as an etch-stop layer in processes in which an exposed layer that needs to be etched overlies a feature whose dimensions are critical to the performance of the structure being fabricated. The etch-stop layer is placed in between the exposed layer and a feature having critical dimensions which, after etching, should not change by more than 5% from their design dimensions. In the etching process, the etch-stop layer is more resistant to the etching plasma that the exposed layer being etched, and thus, substantially reduces the etching rate as etching reaches this layer, effectively stopping the etching processes without etching through the critical feature. In dielectric applications, the etch-stop layer also has to be an effective dielectric with the desired insulating or low-k properties. Silicon oxy-nitride layers provide both the desired dielectric properties and sufficiently increased etch-resistance to function as effective etch-stop layers in such applications. A suitable DP feature 26 comprising an etch-stop layer is the template feature 58 in FIG. 4D or 5A which comprises a hard mask layer 53 or 55 and a template layer 57 or 52; or the patterned hard mask layer 53 in FIG. 5J or 4A. A suitable DP feature 26 comprising a sidewall spacer 60 is shown in FIGS. 4F-4I and 5A-5C.

Figure 6:
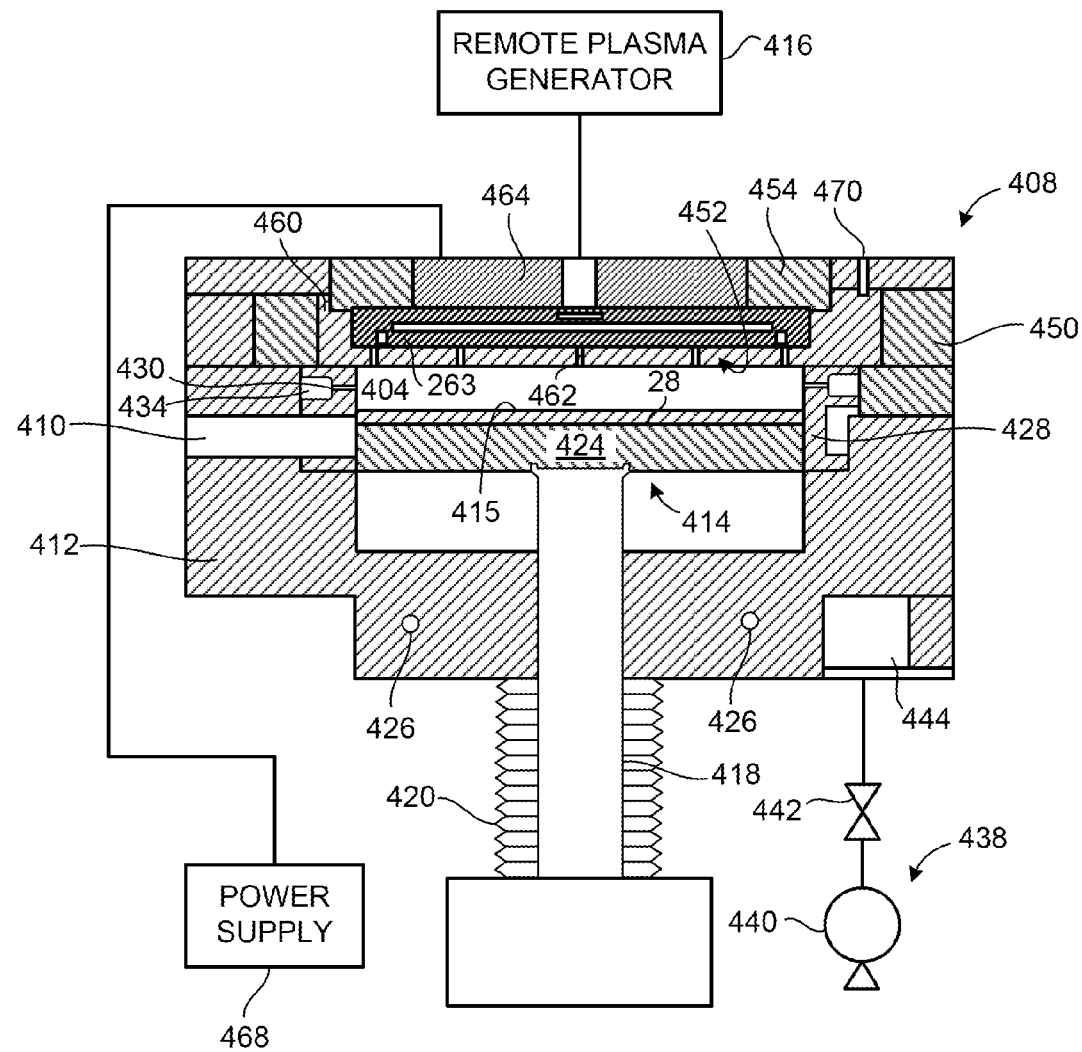
FIG. 6 is a schematic view of an embodiment of a process chamber for performing the etching process.

In the present etching process, a substrate 28, comprising a plurality of DP features 26 that include silicon-containing dielectric, is etched in a process zone 404 of a process chamber 400, an exemplary embodiment of which is illustrated in FIG. 6. In this embodiment, the process chamber 400 includes a lid assembly 408 disposed at an upper end of a chamber enclosure 412, and a substrate support 414 at least partially disposed within the chamber enclosure 412. The process chamber 400 also includes a remote plasma source 416 having a remote electrode with a U-shaped cross section (not shown). The process chamber 400 and components therein can be formed, for example, from aluminum, anodized aluminum, nickel-plated aluminum, nickel-plated aluminum 6061-T6, stainless steel, as well as combinations and alloys thereof. The process chamber 400 is joined to an adjacent transfer chamber and/or load-lock chamber (not shown), or another chamber within a cluster tool. Illustrative cluster tools include, but are not limited to, the PRODUCER™, CENTURA™, ENDURA™, and ENDURASL™ platforms available from Applied Materials, Inc. of Santa Clara, Calif. Additional details of the process chamber may be found in U.S. patent application Ser. No. 11/063,645, filed Feb. 22, 2005 which is incorporated by reference herein in its entirety.

The substrate 28 can be passed into the chamber enclosure 412 through a slit valve 410 which is formed in a sidewall thereof to provide access to the interior of the chamber 400. The slit valve 410 is selectively opened and closed to allow access to the interior of the chamber enclosure 412 by a conventional wafer-handling robot (not shown). The substrate 28 is disposed on the substrate receiving surface 415 of the substrate support 414 which is raised and lowered by a shaft 418 which is enclosed by bellows 420. The substrate 28 may be chucked to the upper surface of a chuck 424 by pulling a vacuum through the chuck 424 or by electrostatic charging. The chuck 424 is then lifted to a processing position within the chamber enclosure 412, and the chamber enclosure 412 is preferably maintained at a temperature of between 50° C. and 80° C. The substrate 28 can be maintained at a desired temperature by passing a heat transfer medium through a channel 426 which is provided for flowing a heat transfer fluid therethrough. The heat transfer fluid can be a heating fluid or a coolant and is used to control the temperature of the chamber enclosure 412 during processing and substrate transfer. The temperature of the chamber enclosure 412 is important to prevent unwanted condensation of the gas or byproducts on the walls of the chamber 400. Exemplary heat transfer fluids include water, ethylene glycol, or a mixture thereof, or even nitrogen gas.

The chamber enclosure 412 further includes a liner 428 that surrounds the substrate support 414 and is removable for servicing and cleaning. The liner 428 can be made of a metal such as aluminum or a ceramic material; however, any process-compatible material may be used. The liner 428 may also be bead blasted to increase the adhesion of any material deposited thereon, thereby preventing flaking of material which results in contamination of the chamber 400. The liner 428 typically includes one or more apertures 430 and a pumping channel 434 formed therein that is in fluid communication with a vacuum system. The apertures 430 provide a flow path for gases into the pumping channel 434, and the pumping channel provides a flow path through the liner 428 so the process gases can exit the chamber 400.

An exhaust system 438 comprises a vacuum pump 440 and a throttle valve 442 to regulate flow of gases within the process chamber 400. The vacuum pump 440 is coupled to a vacuum port 444 disposed on the chamber enclosure 412 and is in fluid communication with the pumping channel 434 formed within the liner 428. The vacuum pump 440 and the chamber enclosure 412 are selectively isolated by the throttle valve 442 to regulate flow of the gases within the chamber 400.

The lid assembly 408 comprises a number of components stacked together, including, for example, a lid rim 450, a gas delivery assembly 452, and a top plate 454. The lid rim 450 is designed to hold the weight of the components making up the lid assembly 408 and is coupled to an upper surface of the chamber enclosure 412 to provide access to the internal chamber components. The gas delivery assembly 452 is coupled to an upper surface of the lid rim 450 to have reduced thermal contact therewith. The components of the lid assembly 408 can be constructed of a material having a high thermal conductivity and low thermal resistance, such as an aluminum alloy.

The gas delivery assembly 452 may comprise a gas distributor 460 which is a showerhead having gas holes 462. A gas supply panel (not shown) is typically used to provide a process gas to the chamber 400. The composition of the process gas depends upon the process to be performed within the chamber 400. For example, the process gas can include etching gases, precursors, reducing gases, catalysts, carriers, purge, cleaning, or any mixture or combination thereof. Typically, the process gas is introduced to the chamber 400 into the lid assembly 408 and then into the chamber enclosure 412 through the gas delivery assembly 452. An electronically operated valve and/or flow control mechanism (not shown) may be used to control the flow of gas from the gas supply into the chamber 400. In one aspect, the gas is delivered from the gas supply panel to the chamber 400 where the gas line tees into two separate gas lines which feed gases to the chamber enclosure 412 as described above. Depending on the process, any number of gases can be delivered in this manner and can be mixed either in the chamber 400 or before they are delivered to the chamber 400.

The lid assembly 408 may further include an electrode 464 to generate a plasma of reactive species within the lid assembly 408. In this embodiment, the electrode 464 is supported on the top plate 454 and is electrically isolated therefrom by isolator rings (not shown) which separate the electrode 464 from the top plate 454. The electrode 464 is coupled to a power supply 468 while the gas delivery assembly 452 is connected to ground. Accordingly, a plasma of a process gas can be ignited in the volume formed between the electrode 464 and the gas delivery assembly 452. The plasma may also be contained within the volumes formed by blocker plates. In the absence of a blocker plate assembly, the plasma is struck and contained in the process zone 404 between the electrode 464 and the gas delivery assembly 452. The power supply 468 energizes the process gas to form a plasma using radio frequency (RF), direct current (DC), alternating current (AC), or microwave (MW) based power discharge. In one version, an RF power supply is coupled to the electrode 464.

Alternatively, the process gas is energized by the remote plasma source 416 to form an energized gas of reactive species which is then delivered into the chamber 400. The remote plasma source 416 energizes the process gas by applying microwave energy to the process gas or using an inductively or capacitively coupled energy applied to the process gas in a gas enclosure within the plasma source 416. Exemplary remote plasma sources are available from vendors such as MKS Instruments, Inc. and Advanced Energy Industries, Inc.

The gas delivery assembly 452 may be heated by a heater 470 (e.g., a resistive heater) which is coupled to the gas delivery assembly 452. In one embodiment, the heater 470 is a tubular member and is pressed into an upper surface of the gas delivery assembly 452. The upper surface of the gas delivery assembly 452 includes a groove or recessed channel having a width slightly smaller than the outer diameter of the heater 470 such that the heater 470 is held within the groove using an interference fit. The heater 470 regulates the temperature of the gas delivery assembly 452.

The process chamber 400 is particularly useful for performing a plasma-assisted dry etching process that requires heating and cooling of the substrate 28 without breaking vacuum. In one embodiment, the process chamber 400 is used to selectively etch and remove portions of DP features 26 that comprise a silicon-containing dielectric, such as silicon dioxide, silicon nitride, and silicon oxy-nitride.

The following examples illustrate embodiments of an etching process performed according to the principles of the present invention. Although the examples may be directed to specific embodiments, the examples should not be interpreted to limit the invention.

In this example, a substrate 28 comprising DP features 26 was transferred onto a substrate receiving surface 415 of the substrate support 414 to expose the surface of the substrate 28 to the process zone 404 and the process chamber 400. The substrate 28 was cooled below 65° C. (e.g., between 15° C. and 50° C.) by passing a heat transfer medium through the fluid channels 426 within the substrate support 414. Typically, the chuck 424 of the substrate support 414 is maintained below about 22° C. to reach the desired substrate temperatures. A continuous flow of coolant is preferred to better control the temperature of the chuck 424. In one version, coolant comprises 50% by volume ethylene glycol and 50% by volume water.

An etching gas is introduced to the chamber 400 to etch away portions of the DP features 26 being formed on the substrate 28 by selectively removing silicon-containing dielectric, such as silicon dioxide, silicon nitride, and silicon oxy-nitride. The volume of etching gas introduced into the chamber 400 depends upon, for example, the thickness of the silicon-containing dielectric to be removed, the geometry of the substrate being cleaned, the volume capacity of the plasma source, the volume capacity of the chamber enclosure 412, as well as the capabilities of the vacuum system coupled to the chamber enclosure 412.

In one version, the etching gas comprises a mixture of hydrogen ($H_2$), nitrogen trifluoride ($NF_3$), and ammonia ($NH_3$). The ratio of the different constituents of the etching gas may be predetermined to selectively remove silicon dioxide, silicon nitride, or silicon oxy-nitride. In one version, the etching gas comprises a molar ratio of ammonia to nitrogen trifluoride of at least a 1:1, or even at least about 3:1. In another version, the etching gas comprises a molar ratio of ammonia to nitrogen trifluoride of from about 5:1 to about 30:1, or even from about 5:1 to about 10:1. Still further, the etching gas comprises a molar ratio of ammonia to hydrogen of from about 1:1 to about 1:10, or even from about 1:1 to about 1:2.

The composition of the etching gases can be selected to control the rate of etching of silicon dioxide, silicon nitride, or silicon oxy-nitride on the substrate 28 relative to other layers which can be below or adjacent to the silicon-containing dielectric of the DP feature 26. For example, by adjusting the flow rate ratio of the different constituents of the etching gas, the etching selectivity of etching the silicon-containing dielectric to adjacent layers or features comprising core material or spacer material oxide may be controlled. In particular, for selective etching of an oxide DP feature 26 adjacent to a nitride core material or spacer material, the etching gas composition can be selected to obtain etching selectivity of about 2:1. For selective etching of a nitride DP feature 26 adjacent to an oxide core material or spacer material, the etching gas composition can be selected to obtain etching selectivity of about 30:1.

In one version, the etching gas comprises hydrogen in a flow rate of from about 10 standard cubic centimeter per minute (sccm) to about 3,000 sccm, or even about 600 sccm. The etching gas also comprises nitrogen trifluoride at a flow rate between about 10 sccm to about 1,000 sccm, or even about 100 sccm. The etching gas further comprises ammonia gas in a flow rate of from about 10 sccm to about 1,000 sccm, or even from about 100 to about 800 sccm, or even about 100 sccm.

The etching gas can also include a diluent gas, such as argon, helium, hydrogen, nitrogen, or mixtures thereof. In one embodiment, the etching gas comprises diluent gas in a volume of from about 80% to about 95%, and the total volume of ammonia, nitrogen trifluoride, and hydrogen being from about 5% to about 20%. Also, the diluent gas can be first introduced into the chamber enclosure 412 before the introduction of the reactive constituents of the etching gas to stabilize the pressure within the chamber enclosure 412. The throttle valve 442 of the chamber 400 is adjusted to maintain the process gas in the process zone 404 at a process pressure of from about 0.5 Torr to about 10 Torr, or even from about 2 Torr to about 5 Torr (e.g., as about 2.5 Torr).

Etching gas having the selected composition is introduced into the remote plasma source 416 which is located outside the process zone 404 of the process chamber 400. The etching gas is energized in the remote plasma source 416 by applying 5-60 watts, such as from about 15-35 watts, of microwave or RF power to the etching gas. The power is capacitively coupled to the etching gas to energize the etching gas. The remote plasma source 416 energizes and ionizes the etching gas externally to the process zone 404 containing the substrate 28, after which the energized gas is introduced into the gas distributor 460 and passed into the process zone 404 of the process chamber 400.

The remote plasma energy applied to the etching gas dissociates the ammonia and nitrogen trifluoride gases into reactive species that combine to form a highly reactive ammonia fluoride (NH$_4$F) compound and/or ammonium hydrogen fluoride (NH$_4$F.HF) in the gas phase. These molecules then flow through the gas delivery assembly 452 via the gas holes 462 of the gas distributor 460 to react with the silicon-containing dielectric of the DP feature 26 on the surface of the substrate 28 being processed. While not intending to be bound by theory, it is believed that the ratio of hydrogen to nitrogen trifluoride to ammonia during the etch process advantageously increases an etch selectivity of the silicon-containing dielectric with respect to other materials such as adjacent core or spacer materials which can be, for example, oxide or nitride materials. Without being limited by an explanation, it is believed the energized NF$_3$ reacts with the H$_2$ and NH$_3$ as:

$$H_2NH_3 + NF_3 \rightarrow NH_4F_{(gas)} \text{ and/or } NH_4F_y.HF_{(gas)}$$

The gaseous reactant product comprising NH$_4$F$_{(gas)}$ and/or NH$_4$F$_y$.HF$_{(gas)}$ reacts with the surface of the silicon-containing dielectric. The interaction of NH$_4$F$_{(gas)}$ and/or NH$_4$F$_y$.HF$_{(gas)}$ with the silicon-containing dielectric forms a solid reactant product 62, as shown for example in FIG. 4G such as (NF$_4$)$_2$SiF$_6$, in the reaction:

$$(NH_4F_{(gas)} \text{ or } NH_4F_y.HF_{(gas)}) + (SiO_x \text{ or } SiN_y \text{ or } SiO_xN_y)_{(solid)} \rightarrow (NF_4)_2SiF_{6(solid)} + H_2O$$

Another possible reaction mechanism occurs when the process gases react directly with the silicon and oxygen atoms present within the silicon-containing dielectric. In one postulated version, the H$_2$, NH$_3$ and NF$_3$ gases interact with the silicon-containing dielectric as follows:

$$H_2NH_3 + NF_3 + (SiO_x \text{ or } SiN_y \text{ or } SiO_xN_y) \rightarrow (NF_4)_2SiF_{6\,(solid)}$$

In a second stage of the etching process, as illustrated for example in FIG. 4H, the solid reactant 62 product formed in the first etching stage is sublimated by heating the substrate 28 on the substrate support 414. The decomposition and/or sublimation of the solid product (NF$_4$)$_2$SiF$_6$ may be described as:

$$(NF_4)_2SiF_{6(solid)} \rightarrow SiF_{4(g)} + NH_{3(g)} + HF_{(g)}$$

The thermal energy supplied to the substrate 28 decomposes the solid product, (NF$_4$)$_2$SiF$_6$, to form a volatilized vapor. In one embodiment, the substrate 28 is maintained at a temperature of at least about 100° C. (e.g., from about 115° C. to about 200° C.) during sublimation. The substrate 28 is heated for a sufficient time to volatilize substantially all the solid reactant product. For example, the substrate 28 can be heated for from about 10 seconds to about 300 seconds (e.g., about 60 seconds) to volatilize the solid reactant product.

In one version, the substrate 28 is heated by heating the substrate support 414 using a heater (not shown) embedded in the substrate support 414. In another method, the substrate 28 is heated by raising the substrate support 414 using a shaft 418 and bellows 420 so that the substrate 28 is elevated to an anneal position in close proximity to the heated gas distributor 460 in the chamber 400 which is at a higher temperature. Alternatively, the substrate 28 can be lifted off the chuck 424 and placed in close proximity to the heated gas distributor 460 by elevating lift pins (not shown) that pass through the substrate support 414. In one version, the substrate 28 is maintained at a distance from the gas distributor 460 of from about 0.25 mm (about 10 mils) to about 5 mm (about 200 mils). The gas distributor 460 is heated by the heater 470 to a temperature of from about 100° C. to about 400° C., such as from about 100° C. to about 180° C. (e.g., about 120° C.). The heat radiated from the gas distributor 460 dissociates or sublimates the thin film of (NH$_4$)$_2$SiF$_6$ formed on the surface of the substrate 28 into volatile SiF$_4$, NH$_3$, and HF products. These volatile products are then removed from the chamber 400 by the vacuum pump 440 of the exhaust system 438. Once the film has been removed from the substrate 28, the process chamber 400 is purged and evacuated. The processed substrate 28 is then removed from the chamber enclosure 412 by lowering the substrate support 414 to the transfer position, de-chucking the substrate 28, and transferring the substrate 28 through the slit valve 410. In still another version, the thermal sublimation process may be carried out by transferring the substrate 28, for example, to an oven, a furnace, a rapid thermal anneal (RTA) apparatus, or other thermal apparatus.

In an alternate embodiment, the etching gas comprises a mixture of hydrogen (H$_2$), ammonia (NH$_3$) and hydrogen fluoride (HF). The hydrogen fluoride source can be anhydrous hydrogen fluoride which is provided to the chamber in gas form. The ratio of the different constituents of the etching gas may be predetermined to selectively remove silicon dioxide, silicon nitride, or silicon oxy-nitride. In one version, the etching gas comprises a molar ratio of ammonia to hydrogen fluoride of at least 1:3, or even at least about 3:1. In another version, the etching gas comprises a molar ratio of ammonia to hydrogen fluoride of from about 5:3 to about 30:1, or even from about 5:3 to about 10:1. Still further, the etching gas comprises a molar ratio of ammonia to hydrogen of from about 1:1 to about 1:10, or even from about 1:1 to about 1:2.

The composition of the etching gases can be selected to control the rate of etching of silicon dioxide, silicon nitride, or silicon oxy-nitride on the substrate 28 relative to other layers which can be below or adjacent to the silicon-containing dielectric of the DP feature 26. For example, by adjusting the flow rate ratio of the different constituents of the etching gas, the etching selectivity of etching the silicon-containing dielectric to adjacent layers or features comprising core material or spacer material oxide may be controlled. In particular, for selective etching of an oxide DP feature 26 adjacent to a nitride core material or spacer material, the etching gas composition can be selected to obtain etching selectivity of about 2:1. For selective etching of a nitride DP feature 26 adjacent to an oxide core material or spacer material, the etching gas composition can be selected to obtain etching selectivity of about 30:1.

In one version, the etching gas comprises hydrogen in a flow rate of from about 10 standard cubic centimeter per minute (sccm) to about 3,000 sccm, or even about 600 sccm. The etching gas also comprises hydrogen fluoride at a flow rate between about 10 sccm to about 1,000 sccm, or even about 100 sccm. The etching gas further comprises ammonia gas in a flow rate of from about 10 sccm to about 1,000 sccm, or even from about 100 to about 800 sccm, or even about 100 sccm.

The etching gas can also include a diluent gas, such as argon, helium, hydrogen, nitrogen, or mixtures thereof. In one embodiment, the etching gas comprises diluent gas in a volume of from about 80% to about 95%, and the total volume of ammonia, hydrogen fluoride, and hydrogen being from about 5% to about 20%. Also, the diluent gas can be first introduced into the chamber enclosure 412 before the introduction of the reactive constituents of the etching gas to stabilize the pressure within the chamber enclosure 412. The throttle valve 442 of the chamber 400 is adjusted to maintain the process gas in the process zone 404 at a process pressure of from about 0.5 Torr to about 10 Torr, or even from about 2 Torr to about 5 Torr (e.g., as about 2.5 Torr).

In the alternate embodiment, the etching gas having the selected composition can be introduced directly to the process zone 404 of the process chamber 400. The hydrogen fluoride reacts with the ammonia and hydrogen to form a highly reactive ammonia fluoride (NH$_4$F) compound and/or ammonium hydrogen fluoride (NH$_4$F.HF) in the gas phase. These molecules react with the silicon-containing dielectric of the DP feature 26 on the surface of the substrate 28 being processed. While not intending to be bound by theory, it is believed that the ratio of hydrogen to hydrogen fluoride to ammonia during the etch process advantageously increases an etch selectivity of the silicon-containing dielectric with respect to other materials such as adjacent core or spacer materials which can be, for example, oxide or nitride materials. Without being limited by an explanation, it is believed that the HF reacts with the H$_2$ and NH$_3$ as:

$$H_2NH_3 + HF \rightarrow NH_4F_{(gas)} \text{ and/or } NH_4F_y \cdot HF_{(gas)}$$

The gaseous reactant product comprising NH$_4$F$_{(gas)}$ and/or NH$_4$F$_y$.HF$_{(gas)}$ reacts with the surface of the silicon-containing dielectric. The interaction of NH$_4$F$_{(gas)}$ and/or NH$_4$F$_y$.HF$_{(gas)}$ with the silicon-containing dielectric forms a solid reactant product 62, as shown for example in FIG. 4G such as (NF$_4$)$_2$SiF$_6$, in the reaction:

$$(NH_4F_{(gas)} \text{ or } NH_4F_y \cdot HF_{(gas)}) + (SiO_x \text{ or } SiN_y \text{ or } SiO_xN_y)_{(solid)} \rightarrow (NF_4)_2SiF_{6(solid)} + H_2O$$

Another possible reaction mechanism occurs when the process gases react directly with the silicon and oxygen atoms present within the silicon-containing dielectric. In one postulated version, the H$_2$, NH$_3$ and HF gases interact with the silicon-containing dielectric as follows:

$$H_2NH_3 + HF + (SiO_x \text{ or } SiN_y \text{ or } SiO_xN_y) \rightarrow (NF_4)_2SiF_{6\,(solid)}$$

In a second stage of the etching process, as illustrated for example in FIG. 4H, the solid reactant 62 product formed in the first etching stage is sublimated by heating the substrate 28 on the substrate support 414. The decomposition and/or sublimation of the solid product (NF$_4$)$_2$SiF$_6$ may be described as:

$$(NF_4)_2SiF_{6(solid)} \rightarrow SiF_{4(g)} + NH_{3(g)} + HF_{(g)}$$

The thermal energy supplied to the substrate 28 decomposes the solid product, (NF$_4$)$_2$SiF$_6$, to form a volatilized vapor. In one embodiment, the substrate 28 is maintained at a temperature of at least about 100° C. (e.g., from about 115° C. to about 200° C.) during sublimation. The substrate 28 is heated for a sufficient time to volatilize substantially all the solid reactant product. For example, the substrate 28 can be heated for from about 10 seconds to about 300 seconds (e.g., about 60 seconds) to volatilize the solid reactant product.

As described in detail above, the substrate 28 can be heated by heating the substrate support 414 using a heater embedded in the substrate support 414 or by raising the substrate support to place the substrate in close proximity to the gas distributor 460, and heating the gas distributor 460. The heat provided to the substrate 28 dissociates or sublimates the thin film of (NH$_4$)$_2$SiF$_6$ formed on the surface of the substrate 28 into volatile SiF$_4$, NH$_3$, and HF products. These volatile products are then removed from the chamber 400 by the exhaust system 438.

Although exemplary embodiments of the present invention are shown and described, those of ordinary skill in the art may devise other embodiments which incorporate the present invention and which are also within the scope of the present invention. Furthermore, the terms below, above, bottom, top, up, down, first and second and other relative or positional terms are shown with respect to the exemplary embodiments in the figures and are interchangeable. Therefore, the appended claims should not be limited to the descriptions of the preferred versions, materials, or spatial arrangements described herein to illustrate the invention.

What is claimed is:

1. A double patterning etching method comprising:
   (a) forming a plurality of double patterning features on a substrate, by:
     (i) forming at least one dielectric layer on the substrate;
     (ii) forming on the substrate, a plurality of first resist features which are spaced apart to form first openings; and
     (iii) after (ii), forming a second resist feature in each first opening to define second openings that are each between adjacent first and second resist features;
     (iv) forming a to layer to fill the second openings; and
     (v) removing the first and second resist features to form a plurality of double patterning features;
   (b) providing in a process zone of a process chamber, the substrate having the double patterning features;
   (c) energizing in a remote chamber, an etching gas comprising nitrogen trifluoride, ammonia, and hydrogen;
   (d) introducing the energized etching gas into the process zone of the process chamber to etch the double patterning features to form a solid residue on the substrate; and
   (e) sublimating the solid residue by heating the substrate to a temperature of at least about 100° C.

2. A method according to claim 1 wherein (a) comprises forming a substrate comprising double patterning features composed of at least one of silicon oxide, silicon nitride, and silicon oxynitride.

3. A method according to claim 1 wherein (a) comprises forming double patterning features comprising an etch-stop layer.

4. A method according to claim 1 wherein (a) comprises forming double patterning features comprising a sidewall spacer.

5. A method according to claim 1 wherein the etching gas comprises a molar ratio of ammonia to nitrogen trifluoride of at least about 1:1.

6. A method according to claim 1 wherein the etching gas comprises a molar ratio of ammonia to nitrogen trifluoride of from about 5:1 to about 30:1.

7. A method according to claim 1 wherein the etching gas comprises a molar ratio of ammonia to hydrogen of from about 1:1 to about 1:10.

8. A method according to claim 1 wherein the etching gas comprises hydrogen in a flow rate of from about 10 sccm to about 3,000 sccm; nitrogen trifluoride in a flow rate of from about 10 sccm to about 1,000 sccm; and ammonia in a flow rate of from about 10 sccm to about 1,000 sccm.

9. A method according to claim 1 wherein the etching gas includes a diluent gas comprising argon, helium, hydrogen, nitrogen, or mixtures thereof.

10. A method according to claim 9 wherein the etching gas comprises diluent gas in a volume of from about 80% to about 95%.

11. A method according to claim 1 wherein the etching gas is energized by applying RF or microwave power at a power level of from about 5 to about 60 watts.

12. A method according to claim 1 wherein (e) comprises maintaining the substrate at an elevated temperature of from about 115° C. to about 200° C.

13. A method according to claim 12 wherein the substrate is maintained at the elevated temperature for from about 10 seconds to about 300 seconds.

14. A method according to claim 1 wherein the process zone comprises a gas distributor, and wherein the substrate is heated by raising the substrate to a distance from the gas distributor of from about 0.25 mm to about 5 mm.

15. A method according to claim 14 wherein the gas distributor is heated to a temperature of from about 100° C. to about 400° C.

16. A double patterning etching method comprising:
(a) forming a substrate having a plurality of double patterning features, by:
  (i) forming at least one dielectric layer on the substrate, the dielectric layer comprising silicon oxide, silicon nitride, or silicon oxynitride;
  (ii) forming on the substrate, a plurality of first resist features which are spaced apart to form first openings; and
  (iii) after (ii), forming a second resist feature in each first opening to define second openings that are each between adjacent first and second resist features;
  (iv) forming a to layer to fill the second openings; and
  (v) removing the first and second resist features to form a plurality of double patterning features;
(b) energizing in a remote chamber, an etching gas comprising nitrogen trifluoride, ammonia and hydrogen, the etching gas comprises a molar ratio of ammonia to nitrogen trifluoride of at least about 1:1, and a molar ratio of ammonia to hydrogen of from about 1:1 to about 1:10;
(c) providing in a process zone of a process chamber, the substrate having the double patterning features, and introducing the energized etching gas into the process zone to etch the double patterning features to form a solid residue on the substrate; and
(d) sublimating the solid residue by heating the substrate to a temperature of at least about 100° C.

17. A double patterning etching method comprising:
(a) forming a substrate having a plurality of double patterning features, by:
  (i) forming at least one dielectric layer on the substrate, the dielectric layer comprising silicon oxide, silicon nitride, or silicon oxynitride;
  (ii) forming on the substrate, a plurality of first resist features which are spaced apart to form first openings; and
  (iii) after (ii), forming a second resist feature in each first opening to define second openings that are each between adjacent first and second resist features;
  (iv) forming a to layer to fill the second openings; and
  (v) removing the first and second resist features to form a plurality of double patterning features;
(b) energizing in a remote chamber, an etching gas comprising hydrogen in a flow rate of from about 10 sccm to about 3,000 sccm, nitrogen trifluoride in a flow rate of from about 10 sccm to about 1,000 sccm, and ammonia in a flow rate of from about 10 sccm to about 1,000 sccm;
(c) providing in a process zone of a process chamber, the substrate having the double patterning features, and introducing the energized etching gas into the process zone to etch the double patterning features to form a solid residue on the substrate; and
(d) sublimating the solid residue by heating the substrate to a temperature of from about 115° C. to about 200° C.

18. A double patterning etching method comprising:
(a) forming on the a substrate, a plurality of double patterning features, by:
  (i) forming at least one dielectric layer on the substrate, the dielectric layer comprising silicon oxide, silicon nitride, or silicon oxynitride;
  (ii) forming on the substrate, a plurality of first resist features which are spaced apart to form first openings; and
  (iii) after (ii), forming a second resist feature in each first opening to define second openings that are each between adjacent first and second resist features;
  (iv) forming a to layer to fill the second openings; and
  (v) removing the first and second resist features to form a plurality of double patterning features;
(b) providing in a process zone of a process chamber, the substrate having the double patterning features;
(c) introducing an etching gas into the process zone of the process chamber to etch the double patterning features to form a solid residue on the substrate, the etching gas comprising hydrogen fluoride, ammonia, and hydrogen; and
(d) sublimating the solid residue by heating the substrate to a temperature of from about 115° C. to about 200° C.

19. A method according to claim 18 wherein the etching gas comprises a molar ratio of ammonia to hydrogen fluoride of at least about 1:3.

20. A method according to claim 18 wherein the etching gas comprises a molar ratio of ammonia to hydrogen fluoride of from about 5:3 to about 10:1.

* * * * *